(12) United States Patent
Subasic et al.

(10) Patent No.: US 7,003,745 B2
(45) Date of Patent: Feb. 21, 2006

(54) PERFORMANCE MODELING FOR CIRCUIT DESIGN

(75) Inventors: Pero Subasic, Pittsburgh, PA (US); Rodney Phelps, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 337 days.

(21) Appl. No.: 10/638,625

(22) Filed: Aug. 11, 2003

(65) Prior Publication Data

US 2004/0243962 A1 Dec. 2, 2004

Related U.S. Application Data

(60) Provisional application No. 60/474,815, filed on May 30, 2003.

(51) Int. Cl.
G06F 17/50 (2006.01)
G06F 10/13 (2006.01)

(52) U.S. Cl. .................. 716/4; 716/18; 703/2; 703/14; 703/15; 703/16; 703/21

(58) Field of Classification Search .................... 716/2, 716/4, 7–10, 17, 18; 703/2, 14–16, 21, 221; 717/101; 702/180
See application file for complete search history.

(56) References Cited

U.S. PATENT DOCUMENTS

| | | | |
|---|---|---|---|
| 5,051,911 A | | 9/1991 | Kimura et al. |
| 5,313,398 A | | 5/1994 | Rohrer et al. |
| 5,379,231 A | | 1/1995 | Pillage et al. |
| 5,918,200 A | * | 6/1999 | Tsutsui et al. .............. 702/180 |
| 6,090,149 A | | 7/2000 | Nair et al. |
| 6,110,214 A | * | 8/2000 | Klimasauskas ................. 703/2 |
| 6,327,557 B1 | * | 12/2001 | Croix ........................ 703/14 |
| 6,405,364 B1 | * | 6/2002 | Bowman-Amuah ......... 717/101 |
| 6,587,992 B1 | | 7/2003 | Marple |
| 6,625,785 B1 | * | 9/2003 | Chatterjee et al. ............. 716/4 |
| 6,662,348 B1 | * | 12/2003 | Naylor et al. .................. 716/9 |
| 6,772,106 B1 | * | 8/2004 | Mahlke et al. ................ 703/21 |
| 6,802,045 B1 | * | 10/2004 | Sonderman et al. ........... 716/2 |
| 6,910,192 B1 | * | 6/2005 | McConaghy ................... 716/2 |
| 2003/0131333 A1 | | 7/2003 | Rutenbar et al. |

(Continued)

OTHER PUBLICATIONS

Lu et al., "A new algorithm for ARMA model parameter estimation using group method of data handling", Apr. 8-9, 2000, Bioengineering Conference, 2000. Proceedings of the IEEE 26th Annual Northeast,Page(s): 127-128, Digital Object Identifier 10.1109/NEBC.2.*

(Continued)

*Primary Examiner*—A. M. Thompson
*Assistant Examiner*—Helen Rossoshek
(74) *Attorney, Agent, or Firm*—Morrison & Foerster LLP

(57) ABSTRACT

Each circuit simulation performed on unique layout of circuit devices generates a design point (DP) that includes device variable values and performance goal values. Circuit models for at least one performance goal are determined as a function of a first subset of the DPs. A performance goal value is determined for each circuit model based on the device variable values obtained from a second subset of the DPs. Errors are determined between the thus determined value of each performance goal and values of the corresponding performance goals obtained from the second subset of the DPs. Input values of device variables are processed with at least one of the circuit models having the smallest error associated therewith to determine therefor a performance goal value. A layout of the circuit devices is generated based on the input device variable values associated with at least one of the thus determined performance goals.

22 Claims, 6 Drawing Sheets

U.S. PATENT DOCUMENTS

2004/0095907 A1    5/2004   Agee et al.

OTHER PUBLICATIONS

Sakaguchi et al., "A design of generalized minimum variance controllers using a GMDH-type neural network for nonlinear systems", 1999, Systems, Man, and Cybernetics, IEEE Conference Proceedings. IEEE International Conference on, vol.4, pp.: 1090-1095.*

Bleszynski, E. et al. (Sep.-Oct.1996). "AIM: Adaptive integral method for solving large-scale electromagnetic scattering and radiation problems," *Radio Science*, 31(5):1225-1251.

Celestry Design Technologies, Inc. (2001). *BSIMPro+™ User Manual—Basic Operations*. Version 2001.3, pp. vii-xiii. (Table of Contents).

Celestry Design Technologies, Inc. (2001). *BSIMPro+™ User Manual—Device Modeling Guide*. Version 2001.3, pp. vii-xii. (Table of Contents).

Cook, P. W. (Sep. 1984). "Constraint solver for generalized IC layout," *IBM Journal of Research and Development*, 28(5):581-589.

Cormen, T. H. et al. (2001). *Introduction to Algorithms*. 2nd Edition, McGraw-Hill Book Company, pp. 588-605.

Foty, D. P. (1997). *MOSFET Modeling with SPICE: Principles and Practice*. PTR Prentice Hall: Upper Saddle River, NJ, pp. v-ix (Table of Contents).

Ling, F. et al. (May 2000). "An Efficient Algorithm for Analyzing Large-Scale Microstrip Structures Using Adaptive Integral Method Combined with Discrete Complex-Image Method," *IEEE Transactions on Microwave Theory and Techniques*, 48(5):832-839.

Liu, W. (2001). *MOSFET Models for SPICE Simulation, Including BSIM3v3 and BSIM4* John Wiley & Sons, Inc. pp. vii-x (Table of Contents).

Phillips, J. R. et al. (Oct. 1997). "A Precorrected-FFT Method for Electrostatic Analysis of Complicated 3-D Structures," *IEEE Transactions on Computer-Aided Design of Integrated Circuits and Systems*, 16(10):1059-1072.

Johan Suykens; "A (short) Introduction To Support Vector Machines and Kemelbased (sic) Learning"; ESANN 2003, Bruges, Belgium, Apr. 2003; pp. 1-20.

Marti A. Hearst; "Support Vector Machines"; University Of California Berkley; Jul./Aug. 1998; pp. 18-28.

Group Method of Data Handling (GMDH); http://www.gmdh.net; printed May 28, 2003; 25 Pages.

* cited by examiner

| | ERROR | CALCULATED PERFORMANCE GOAL I VALUE | VALIDATION PERFORMANCE GOAL I VALUE |
|---|---|---|---|
| 1st CIRCUIT MODEL ERRORS | $IE_1$ $IE_2$ | PGIC-ICM(DP9) PGIC-ICM(DP10) | PGIV(DP9) PGIV(DP10) |
| 2nd CIRCUIT MODEL ERRORS | $2E_1$ $2E_2$ | PGIC-2CM(DP9) PGIC-2CM(DP10) | PGIV(DP9) PGIV(DP10) |

FIG. 5

| INPUT SET OF DEVICE VARIABLE VALUES | PERFORMANCE GOAL VALUE |
|---|---|
| 1 | $PGIC_1$ |
| 2 | $PGIC_2$ |
| 3 | $PGIC_3$ |
| ⋮ | ⋮ |
| X | $PGIC_X$ |

FIG. 6

PERFORMANCE MODELING FOR CIRCUIT DESIGN

CROSS REFERENCE TO RELATED APPLICATION

This application claims benefit from Provisional Patent Application No. 60/474,815, filed May 30, 2003, entitled "Performance Modeling For Analog Circuit Design".

BACKGROUND OF THE INVENTION

1. Field of the Invention

The present invention relates to automated integrated circuit design and, more particularly, to the design of analog or mixed signal, analog and RF circuit design.

2. Description of Related Art

In circuit synthesis processes in use today, a combination of independent device variables representing device parameters of the circuits are fed into a specialized computer program called a circuit simulator that computes performance features, i.e., performance goals, of the circuit. The circuit simulation process is based on highly complex models of devices and the interconnections between them. The simulation time necessary to characterize all performance goals can be long. Naturally, these times tend to further increase with the increase of the circuit complexity. Furthermore, the nature of the synthesis process is such that a large number of design alternatives, also called design points, are visited in order to find one design point with a desirable combination of performance goals. This process is so time consuming and resource intensive that it is desirable to utilize a parallel computer architecture in order to speed it up and complete it in a reasonable time period. Even so, the circuit synthesis process is still very time intensive and in some cases lasts for several hours to a day.

Finding the optimal design point is a task that follows circuit synthesis. During this process, the circuit designer examines design points generated by circuit synthesis to select a single best design point for circuit implementation on a chip. Although it is possible to increase the efficiency of this process by using advanced visualization and data mining techniques, it is still not possible for the designer to examine regions/gaps in the design space not yet explored by the circuit synthesis algorithm. These regions/gaps result because the circuit synthesis algorithm tries to reduce the number of examined design points in order to arrive at a good design point faster. Therefore, the circuit synthesis algorithm tries to narrow the exploration region and reduce the number of generated design points.

Successfully managing the ever increasing complexity of modem IC design has required continuous improvements to the design process. Central to these improvements is the notion of starting at a high level of abstraction and systematically adding detail as the design progresses through the schematic, layout, chip-assembly and fabrication steps.

Beginning the design process at a high level of abstraction allows the designer to concentrate on the most important tradeoffs and not to become quagmired in the details. However, there are drawbacks. Incomplete information can often lead to poor assumptions and an under-performing final design that must iterate multiple times through the design process to finally reach closure on its performance goals. This is especially true in the case of a mixed signal, analog and RF design where signals are continuous-valued and noise is a critical consideration. This is an undesirable situation for the following simple reason: as design time increases, the time to market increases, and the final profit realized from the IC product decreases.

There are several steps in the design process that can be improved by utilizing a circuit model of a circuit versus a circuit simulator. These include (1) faster design/synthesis with increased quality by iterating through the circuit sizing/synthesis part of the design process and exploring more design alternatives in the process; (2) the ability to communicate how parasitics affect circuit performance goals during the layout process to avoid redesign using a model of device variables to performance goals to compensate for parasitics; (3) assessment of the impact of manufacturing or environmental variations on performance goals; and (4) in a hierarchical design, pre-built models can be used for sub-circuits instead of simulators for faster calculation of performance goals.

Automatic circuit sizing/synthesis utilizing a circuit model is a fast and convenient way to explore a large number of circuit designs in a relatively small amount of time. In the final stage, when a designer needs to explore the generated design space and pick a single point for implementation, this process can be significantly improved by allowing the designer to concentrate on those regions in the design space they find interesting, and then perform more detailed analysis in those regions. Circuit modeling enables rapid and efficient support for this process by generating more design points and performance goal values than the simulator-driven approach. Increased speed also brings another important benefit, namely, the possibility to explore regions of the design space with a finer level of detail, thereby increasing the probability that a better design will be found. Gain is thus twofold: increased speed and increased level of detail.

After the initial, simulator based circuit sizing, a designer tries to produce circuit layouts. By changing the size and/or position of cells and devices and, hence, the placement of wiring in a circuit design, a designer introduces effects on the circuit design not accounted for in the initial circuit sizing. These effects are the result of the size and/or position of cells and devices, wiring placement, as well as the mutual influences of devices called parasitics. Even though these parasitic influences are typically very small, they can noticeably affect the performance goals of the circuit. By utilizing a circuit model in the design process, iterations between sizing and layout utilizing the circuit simulator can be avoided thereby increasing the probability of first pass success.

Circuit models can be utilized to evaluate the influence of parasitics on performance goals. The gain is twofold: first, the process is much faster since using the model is much faster than using a circuit simulator; second, since this process requires a large number of points to be explored (typically an order of magnitude larger than in the sizing/synthesis run), it is appropriate to use a model (instead of the simulator) to generate them (again because of speed). This means that the process of estimating the impact of a large number of different layouts to performance goals can be automated. By increasing the number of explored circuit layouts, the probability that the improved design/layout will be found increases.

Manufacturing variations are variations in device characteristics due to imperfect manufacturing processes. Environmental variations are variations in device characteristics due to environmental variations such as temperature or humidity. Special variables can be introduced in the modeling process to account for these variations. Because of the increased speed and possibility to generate and investigate many more alternatives, the quality of the final design by using circuit models is increased.

Complex circuits are designed and built by using lower-level basic circuits as building blocks. This process is known as hierarchical design, and the underlying modeling process is known as hierarchical modeling. Prebuilt circuit models can be used as building blocks to build models of higher level circuits. The main gain here is that the speed of existing models and their availability eliminates the need to use simulators for at least a part of the already complex circuit whereupon the simulation time is significantly reduced.

What is needed, however, but not disclosed in the prior art, is a method of circuit modeling that avoids the use of a single model building technique to develop the circuit models for each performance goal of a circuit.

SUMMARY OF THE INVENTION

The invention is an automated integrated circuit design method that includes inputting an initial layout of interconnected circuit devices that define a circuit and performing a plurality of circuit simulations for the circuit, with each circuit simulation performed for a unique layout of the circuit devices. Each circuit simulation generates a design point that includes a plurality of device variables for the circuit devices and a plurality of performance goals for the circuit, wherein each device variable and each performance goal has a value associated therewith. The thus determined design points are allocated between a first subset of model building design points and a second subset of validation design points. First and second model building techniques are utilized to determine as a function of the model building design points first and second circuit models for one of the performance goals. For each validation design point—first circuit model pair, a value for the one performance goal is determined as a function of said first circuit model and the values of the device variables of said validation design point. For each validation design point—first circuit model pair, an error is determined between the thus determined value of the one performance goal and the values of corresponding performance goals of the validation design points. An average of the thus determined errors is then determined in connection with the first circuit model. Next, for each validation design point—second circuit model pair, a value for the one performance goal is determined as a function of said second circuit model and the values of the device variables of said validation design point. For each validation design point—second circuit model pair, an error is determined between the thus determined value of the one performance goal and the values of corresponding performance goals of the validation design points. An average of the thus determined errors is then determined in connection with the second circuit model. A set of values for the device variables is then input and processed with at least one of the first and second circuit models having the smallest average error associated therewith to determine at least one value for the one performance goal associated therewith. Based on the thus determined value of the at least one performance goal, a layout is generated of the circuit devices based upon the values of the device variables input for said thus determined one performance goal.

Desirably, the model building design points and the validation design points are non-overlapping. The first and second model building techniques are desirably a Group Method of Data Handling (GMDH) model building technique and a Support Vector Machines (SVM) model building technique, respectively.

The method can further include scaling each device variable value and each performance goal value of each design point within a predetermined numerical range. The one performance goal determined from the input set of values of the device variables can then be unscaled to determine the actual value of the performance goal.

In at least one of the first and second model building techniques, the values of at least two device variables can be combined to obtain a new value that replaces said two device variables in the model.

The first model building technique can be utilized to determine a plurality of first circuit models for the one performance goal and the second model building technique can be utilized to determine a plurality of second circuit models for the one performance goal. In connection with each first circuit model an average can be determined of the errors for each validation design point—first circuit model pair. Moreover, for each second circuit model an average can be determined of the errors determined for each validation design point—second circuit model pair.

The step of processing the input set of values to determine at least one value for the one performance goal can include determining a difference between the value of the one performance goal determined utilizing the first circuit model having associated therewith the smallest error of the plurality of first circuit models and the value of the one performance goal determined utilizing the second circuit model having associated therewith the smallest error of the plurality of second circuit models and displaying the thus determined difference.

A first circuit model can be determined for each performance goal of a subset of the model building design points and a second circuit model can be determined for each performance goal of the subset of model building design points. For each first circuit model, an average of the errors determined for each validation design point—first circuit model pair can be determined and for each second circuit model an average of the errors determined for each validation design point—second circuit model pair can be determined. The processing of the input set of device variables to determine at least one value for the one performance goal can include processing the input set of device variable values with the first or second model of each performance goal of the subset of model building design points having the smallest average error associated therewith to determine a value for the performance goal. Lastly, the step of generating a layout of the circuit devices can include, based on the values determined for each performance goal, generating a layout of the circuit devices based on the values of the device variables input for said performance goals.

The invention is also an automated integrated circuit design method that includes: (a) inputting an initial layout of interconnected circuit devices that define a circuit; (b) performing a plurality of circuit simulations for the circuit, with each circuit simulation performed for a unique layout of the circuit devices, with each circuit simulation generating a design point that includes device variable values for the circuit devices and performance goal values for the circuit; (c) determining a plurality of different circuit models for one of the performance goals as a function of a first subset of the design points; (d) determining for each circuit model a value for the one performance goal as a function of the circuit model and the values of the device variables obtained from a second subset of the design points; (e) determining for each circuit model errors between the value of the one performance goal determined in step (d) and values of the corresponding performance goals obtained from the second subset of design points; (f) inputting a set of device variable values; (g) processing the input set of device variable values with at least one of the circuit models having the smallest error associated therewith to determine at least one value for the one performance goal; (h) repeating steps (f) and (g) a plurality of times with a new set of device variable values input in each iteration of step (f); and (i) generating a layout of the circuit devices utilizing the device variable values processed in one repetition of step (g).

Step (c) can further include determining a first circuit model and a second circuit model for the one performance goal.

Step (c) can also include determining a plurality of different circuit models for each performance goal of the circuit and step (g) can further include processing the input set of device variables with the circuit model associated with each performance goal having the smallest error associated therewith to determine a value for the performance goal.

Any one or combination of the foregoing steps can be embodied in instructions stored on a computer readable medium. When the instructions are executed by a processor, the instructions cause the processor to perform any one or a combination of the foregoing steps.

BRIEF DESCRIPTION OF THE DRAWINGS

FIG. 5 is a graph of errors as a function of calculated and validation performance goals; and FIG. 6 is a chart showing the relationship of input sets of device variable values versus performance goal values.

DETAILED DESCRIPTION OF THE INVENTION

The present invention will be described with reference to the accompanying figures where like reference numbers correspond to like elements.

The present invention is a method which is desirably embodied in computer readable program code which executes on a processor of a computer system, e.g., a stand-alone or networked computer or workstation, that includes a computer storage, an input/output system, such as a keyboard, mouse and monitor, a media drive, such as a disk drive, CD ROM drive, etc., and a computer-usable storage medium capable of storing the computer readable program code that embodies the present invention. Under the control of the computer readable program code, the processor is capable of configuring and operating the computer system in a manner to implement the present invention. Computer systems of the type described above are well known in the art and are not described herein for purpose of simplicity.

Figure 1A:
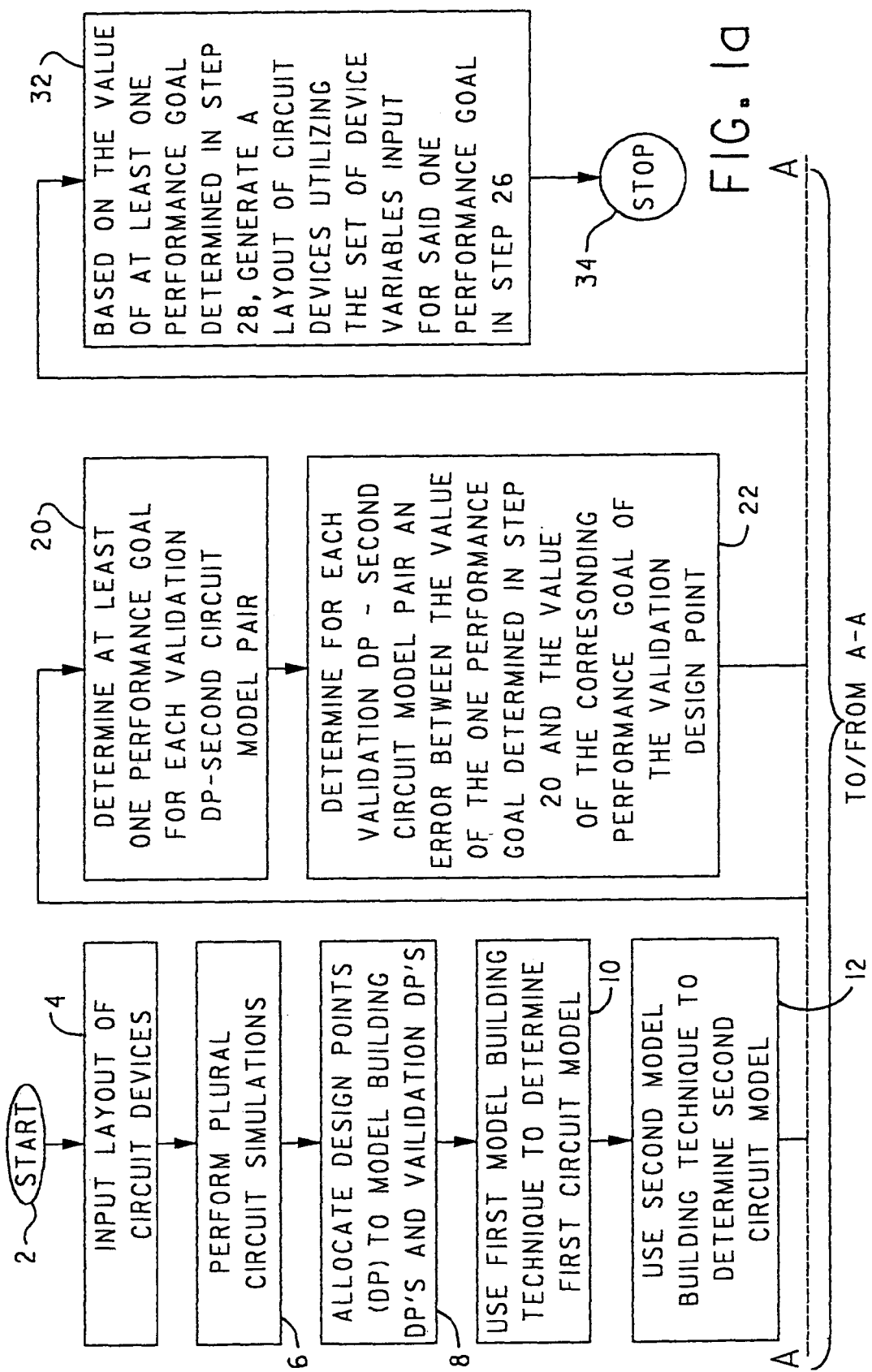
FIGS. 1a and 1b are a flowchart of a method in accordance with the present invention.
Figure 1B:
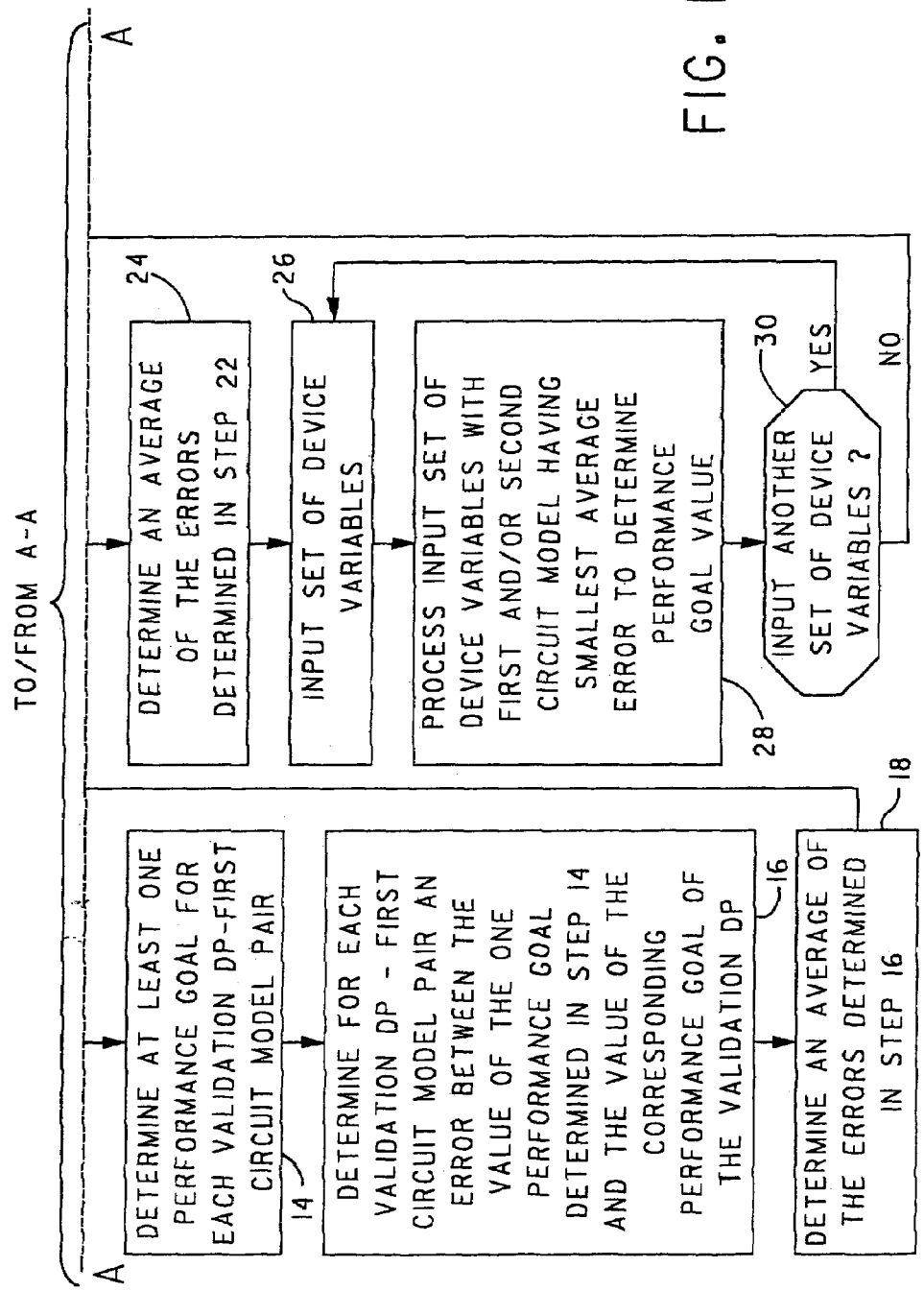
Figure 2:
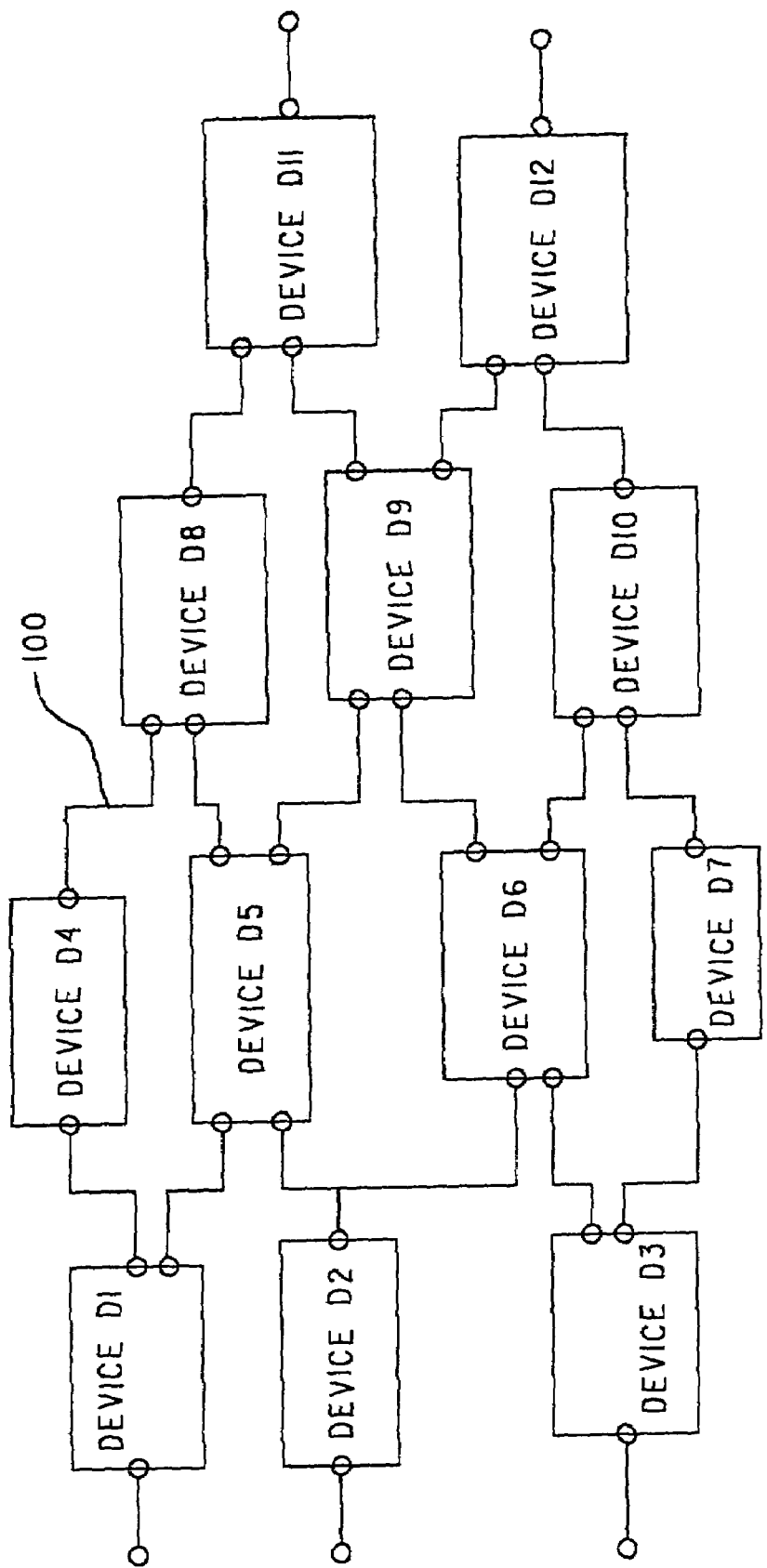
FIG. 2 is an exemplary initial layout of circuit devices forming a circuit.

With reference to FIGS. 1a, 1b and 2, the method begins by advancing from a start step 2 to a step 4 where an initial layout of circuit devices that define a circuit topology are input into the computer system. The circuit topology includes a collection of active and passive circuit devices, e.g., D1–D12, interconnected by conductors 100 to desirably perform a predetermined function. In step 4, no device parameters, e.g., gate of a transistor, resistance of a resistor, capacitance of a capacitor, etc., are assigned to any of the circuit devices.

Figure 3:
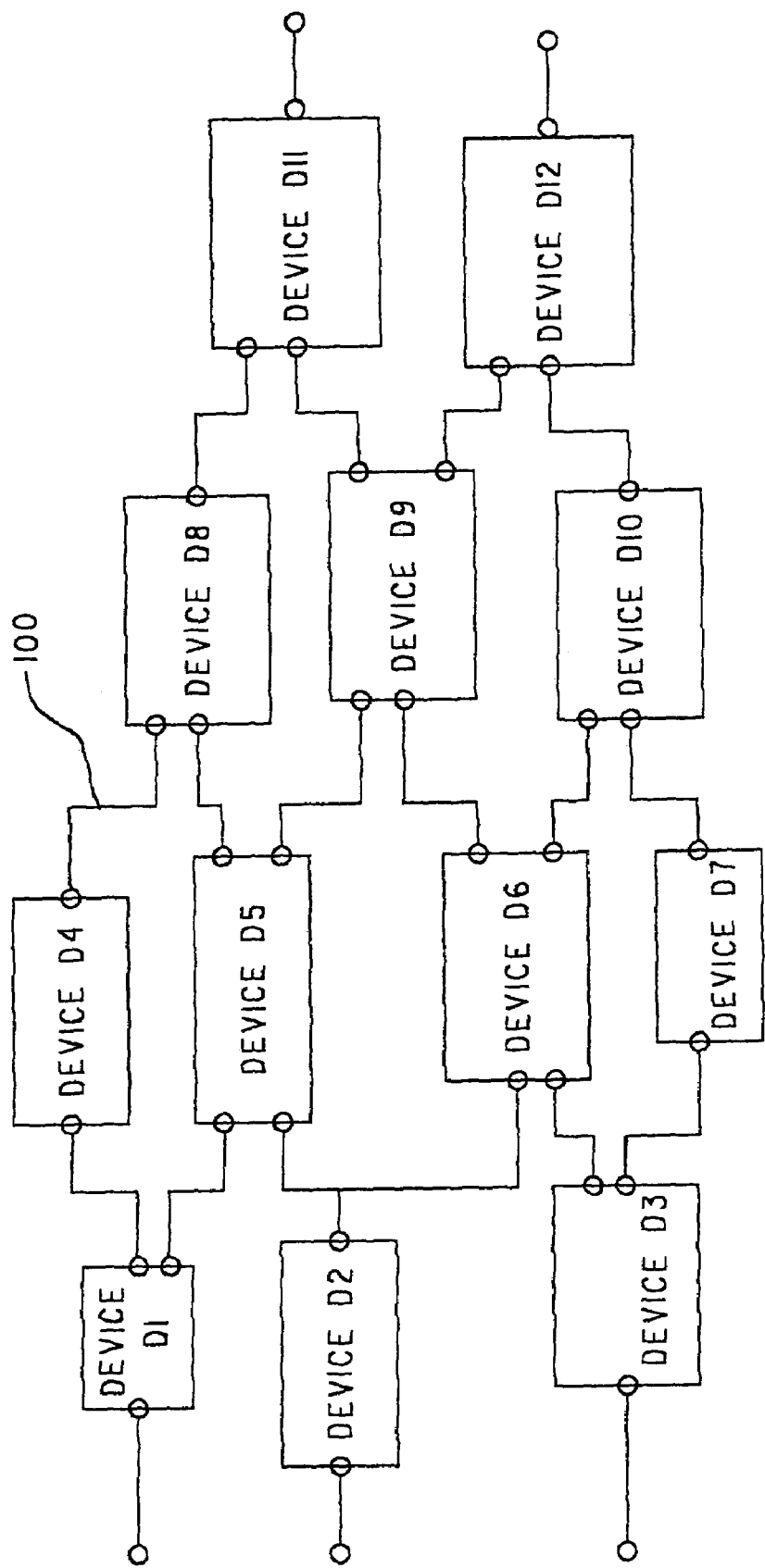
FIG. 3 is a layout of the circuit devices shown in FIG. 2 with device D1 resized and device D3 repositioned.

With reference to FIG. 3, and with continuing reference to FIGS. 1a, 1b and 2, the method then advances to a step 6 where a plurality of circuit simulations are performed for a plurality of unique layouts of the circuit devices. Each circuit simulation generates a design point that includes values for a plurality of device variables for the circuit devices and values for a plurality of performance goals for the circuit layout. For example, a circuit simulation is performed for the layout of circuit devices shown in FIG. 2 to generate a design point that includes values for the device variables of circuit devices D1–D12 and values for the performance goals for the circuit. Thereafter, the layout of circuit devices D1–D12 is modified, for example, to the layout shown in FIG. 3. In general, the layout of circuit devices can be modified in two ways. First, one or more circuit devices of a layout can be resized. Second, one or more circuit devices can be repositioned. In the layout of circuit devices shown in FIG. 3, device D1 has been resized versus its size in FIG. 2 and device D3 in FIG. 3 has been repositioned versus its position in FIG. 2. The resizing and repositioning of circuit devices D1 and D3, respectively, between FIGS. 2 and 3, however, is not to be construed as limiting the invention since the resizing of one or more circuit devices can be performed independent of the repositioning one or more circuit devices, and vice versa.

Figure 4:
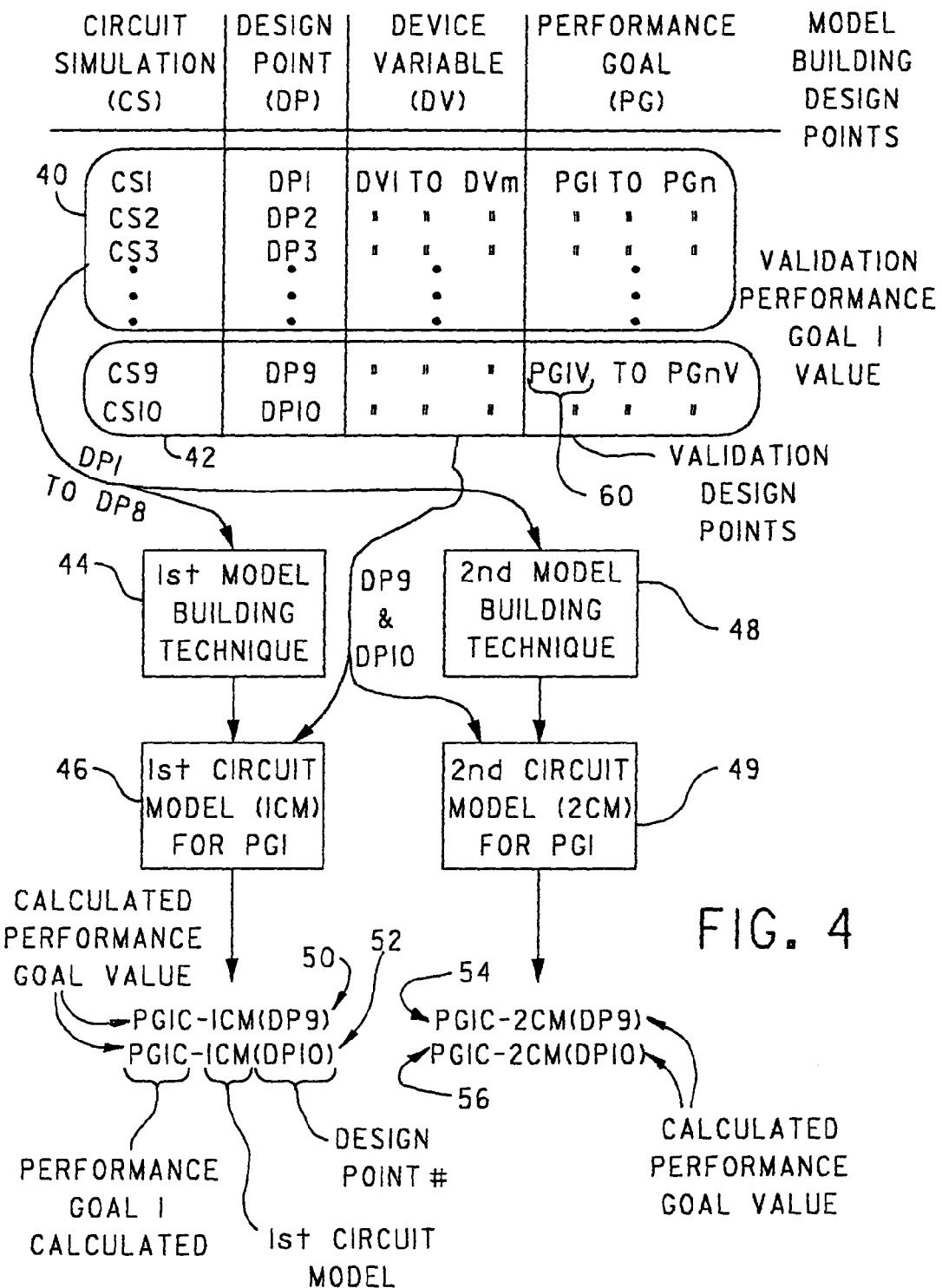
FIG. 4 is a graphical illustration of the manner in which data is manipulated in accordance with the present-invention.

With reference to FIG. 4, and with continuing reference to all previous figures, once a desired number of circuit simulations have been performed for a like number of unique layouts of circuit devices D1–D12, the method advances to step 8 where the design points generated by the circuit simulations are allocated between model building design points (DP1–DP8) 40 and validation design points (DP9 and DP10) 42. For example, as shown in FIG. 4, if ten circuit simulations CS1–CS10 are performed in step 6, ten design points DP1–DP10, respectively, will be generated. Each design point DP1–DP10 has device variables DV1–DVm and performance goals PG1–PGn associated therewith. Because each design point is for a different circuit layout, the values assigned to one or more device variables DV1–DVm and/or one or more performance goals PG1–PGn can be different for each pair of design points. It is to be appreciated, however, that depending on the change in the layout between any two design points, some of the device variables and/or performance goals can be the same for two or more design points.

Next, the method advances to step 10 where a first model building technique 44 is utilized to build a first circuit model 46. More specifically, first model building technique 44 processes the values of device variables DV1–DVm and the values of performance goals PG1–PGn of model building design points DP1–DP8 to determine first circuit model 46.

Program flow then advances to step 12 where a second, different model building technique 48 processes the values of device variables DV1–DVm and the value of performance goals PG1–PGn of model building design points DP1–DP8 to generate a second, different circuit model 49.

First and second model building techniques 44 and 48 can generate a plurality of first circuit models and a plurality of second circuit models, respectively, with each circuit model defining the relationship between device variables DV1–DVm and one of the performance goals PG1–PGn. For example, first and second circuit models 46 and 49 each define a relationship between device variables DV1–DVm and performance goal PG1. Additional first and second circuit models (not shown) output by first and second model building techniques 44 and 48 can define the relationship between device variables DV1–DVm and other performance goals PG of the circuit. For simplicity of description, the present invention will be described in connection with first and second circuit models 46 and 49 each defining a relationship between their respective values of device variables DV1–DVm and performance goal PG1. However, this is not to be construed as limiting the invention.

Next, the method advances to step 14 where for each validation design point—first circuit model pair, a value for each performance goal PG1–PGn is determined as a function of the first circuit model and the device variable values of validation design points DP9, DP10. For example, the values of device variables DV1–DVm of design point DP9 are processed by first circuit model 46 to produce a calculated performance goal value (PG1C–1CM(DP9)) 50 for design point DP9. Similarly, first circuit model 46 processes the values of device variables DV1–DVm of design point DP10 to produce a calculated performance goal value (PG1C–1CM (DP10)) 52 for design point DP10.

With reference to FIG. 5, and with continuing reference to all previous figures, the method then advances to step 16 where for each validation design point—first circuit model pair, an error is determined between the thus determined calculated performance goal value and the value of the corresponding performance goal of the validation design point. Each error is calculated by taking the absolute value of the calculated performance goal value minus the corresponding validation performance goal value. For example, in FIG. 4, where only one first circuit model 46 for performance goal PG1 is shown, a first error value for the first circuit model ($1E_1$) 58 for design point DP9 is determined by taking the absolute value of the difference between the value of calculated performance goal 50 and the value of validation performance goal PG1V of design point DP9 60. A second error value for the first circuit model ($1E_2$) 62 is determined by taking the absolute value of the difference between the value of calculated performance goal 52 and the value of validation performance goal PG1V of design point DP10 64. If additional first circuit models 46 are generated by first model building technique 44 for additional performance goals, e.g., PG2, PG3, . . . , PGn, similar error values would be determined for each validation design point—first circuit model pair.

Once all the error values for first circuit model 46 have been determined, the method advances to step 18 where an average of the errors determined in step 16 for first circuit model 46 is determined by taking the sum of the error values for the first circuit model and dividing this sum by the number of error values, e.g., ($1E_1+1E_2$)/2.

Next, the method advances to step 20 where for each validation design point—second circuit model pair, a value for each performance goal is determined as a function of the second circuit model and the device variable values of validation design points DP9 and DP10. More specifically, second circuit model 49 processes the values of device variables DV1–DVm of design point DP9 to produce a calculated performance goal value 54. Similarly, second circuit model 49 processes the values of device variables DV1–DVm of design point DP10 to produce calculated performance goal value 56.

The method then advances to step 22 where for each validation design point—second circuit model pair, an error is determined between the thus determined calculated performance goal value and the value of the corresponding performance goals of the validation design point. For example, FIG. 4, where only one second circuit model 49 for performance goal PG1 is shown, a first error value for second circuit model ($2E_1$) 66 is determined by taking the absolute value of the difference between calculated performance goal value 54 and the value of performance goal PG1V of design point DP9 60. A second error value for second circuit model error ($2E_2$) 66 is determined by taking the absolute value of the difference between calculated performance goal value 56 and the value of performance goal PG1V of design point DP10 64. If additional second circuit models 49 are generated by second model building technique 48 for additional performance goals, e.g., PG2, PG3, . . . , PGn, similar error values would be determined for each validation design point—second circuit model pair.

The method then advances to step 24 where an average of the errors determined in step 22 for second circuit model 49 is determined by taking the sum of the error values for the second circuit model errors and dividing this sum by the number of error values, e.g., ($2E_1+2E_2$)/2. Once the average error values have been determined for first and second circuit models 46 and 49, a new set of values for device variables DV1–DVm representing a new layout of devices D1–D12, desirably, not already processed by the circuit simulator, can be input into the computer system in step 26.

The foregoing steps 2–24 describe a model building phase of the method. Steps 26–34 for a model utilization phase of the method will now be described.

In step 28, the set of values for the device variables input in step 26 are processed by first circuit model 46 and/or second circuit model 49 having the smallest average error associated therewith to determine a calculated performance goal value PG1C. Where first model building technique 44 produces a plurality of first circuit models 46 for performance goal PG1 and second model building technique 48 produces a plurality of second circuit models 49 for performance goal PG1, the circuit model of the plurality of first circuit models 46 or the plurality of second circuit models 49 having the smallest error associated therewith is utilized to process the new set of device variables. Alternatively, an average of the calculated performance goals PG1C determined for the first and second circuit models 46 and 49 having the smallest average errors associated therewith can be determined.

Once the calculated performance goal value PG1C has been determined in step 28 for the set of device variables values input in step 26, the method advances to step 30 where a determination is made whether another, new set of values for the device variables are to be input into the computer system. If so, the method returns to step 26 where this other, new set of values for the device variables is input and step 28 where a calculated performance goal value PG1C is determined therefor. FIG. 6 shows a relationship between each input set of device variables values input in step 26 and corresponding calculated performance goal values PG1C determined in step 28. Once a desired number of sets of values for the device variables have been input, the method advances from step 30 to step 32.

In step 32, a layout of circuit devices is generated utilizing the values for the device variable input in step 26 based on one of the calculated performance goal value(s) determined in step 28. For example, suppose in FIG. 6, that calculated performance goal value $PG1C_3$ is the most desirable for the circuit. Accordingly, a layout of the circuit devices is generated utilizing input set 3 of the values for the device variables corresponding to performance goal value $PG1C_3$.

Once the layout of circuit devices has been generated, the method advances to stop step 34.

In the foregoing example, first and second model building techniques 44 and 48 were described as generating one first circuit model 46 for performance goal PG1 and one second circuit model 49 for performance goal PG1, respectively. In practice, however, first model building technique 44 can, and typically does, generate a plurality of first circuit models 46 for each performance goal of the circuit and second model building technique 48 can, and typically does, generate a plurality of second circuit models 49 for each performance goal of the circuit. When each performance goal of the circuit has a plurality of first circuit models associated therewith, in step 14 the method determines for each validation design point—first circuit model pair a calculated performance goal value associated with said pair as a function of said first circuit model and the values for the device variables of said validation design point. Examples of such calculated performance goal values include calculated performance goal values 50 and 52 in FIG. 4. In step 16, the method determines for each validation design point—first circuit model pair, errors between the thus determined calculated performance goal values and the values of the corresponding performance goals of the validation design points in the manner discussed above in connection with FIG. 5. In step 18, for each performance goal in connection with the first circuit model, an average of the thus determined errors is determined for the performance goal.

Similarly, when second model building technique 48 determines a plurality of second circuit models 49 for each performance goal of the circuit, step 20 includes determining for each validation design point—second circuit model pair a calculated performance goal value associated with said pair as a function of said second circuit model and the device variable values of said validation design point. Examples of such performance goal values include calculated performance goal values 54 and 56 in FIG. 4.

Thereafter, in step 22, the method determines for each validation design point—second circuit model pair, errors between the thus determined calculated performance goal value and the values of corresponding performance goals of the validation design points in the manner discussed above in connection with FIG. 5. Next, in step 24, for each performance goal in connection with the second circuit model, an average of the thus determined errors is determined for the performance goal.

Next, in step 28, each set of values for the device variables input in step 26 are processed with the first or second circuit model associated with each performance goal having the smallest average error associated therewith to determine a value for the performance goal corresponding to the input set of values for the device variables. In step 32, the values for the device variables that generated the most desirable combination of performance goals for the circuit are utilized to generate the layout of the circuit devices.

As can be seen, when first and second model building techniques 44 and 48 generate one or more first circuit models 46 and one or more second circuit models 49 for each performance goal, the circuit model having the smallest error associated therewith for each performance goal can be utilized to determine a value for said performance goal. Hence, for each performance goal, the circuit model that best models the relationship between design variable values and the corresponding value of the performance goal is utilized. Because of this, some performance goals may utilize one of the first circuit models 46 or one of the second circuit models 49 to determine the corresponding performance goal. However, this is not to be construed as limiting the invention.

To facilitate processing, the values of the device variables and performance goals of each design point can be scaled to within a predetermined numerical range utilizing any well known scaling technique in order to generate each first and second circuit models 46 and 49. Once one or more performance goal values have been determined in step 28 based on the thus determined first and second circuit models 46 and 49, the inverse of the scaling technique can be utilized to unscale the value of each performance goal to facilitate direct comparison to a corresponding desired performance goal for the circuit. The scaled or unscaled values of two or more device variables in the first and/or second model building techniques 44 and 48 can also be combined to obtain a new value that replaces said two or more device variables in the model. In this way, unnecessary numerical manipulation by the first and/or second model building techniques 44 and 48 is avoided.

As discussed above, first and second model building techniques 44 and 48 are different model building techniques. Desirable first and second model building techniques include a Group Method of Data Handling (GMDH) model building technique and a Support Vector Machines (SVM) model building technique. The description of these model building techniques, however, is not to be construed as limiting the invention since the use of any suitable model building technique is envisioned. Since the GMDH and SVM model building techniques are well known in the art, specific details regarding each of these techniques is not included herein for simplicity of description. Generally, however, in the GMDH model technique, values of device variables DV1–DVm of model building design points DP1–DP8 are received at nodes of an input layer of a GMDH matrix. The values for the device variables received at the input nodes are passed therefrom in unique pairs to nodes of a first layer where each unique pair of device variables are mapped utilizing a quadratic equation of the type:

$$F(x_1, x_2) = a_0 + a_1 x_1 + a_2 x_2 + a_3 x_1 x_2 + a_4 x_1^2 + a_5 x_2^2$$

Outputs from the nodes of the first layer are input in unique pairs into nodes of a second layer where unique pairs of these inputs are combined using the above-identified quadratic equation. This procedure is repeated for a desirable number of successive layers. In practice, the GMDH modeling technique utilizes two data sets A and B of equal size. As the GMDH network is generated, two models are built in parallel: a model based on data set A and a model based on data set B. General information regarding the history, evolution and application of the GMDH modeling technique in numerous different fields other than circuit synthesis can be found in the following web site: www.gmdh.net.

A suitable node selection criteria can be used in each layer to avoid the number of nodes in each successive layer from increasing excessively according to the formula $$C = L(L-1)/2$$

where L=number of nodes in the current layer and C=number of nodes in the next successive layer.

Examples of suitable node selection criteria include symmetric regularity criterion, symmetric stability criterion and minimum coefficient bias criterion.

The symmetric regularity criterion computes a sum of cross-errors between outputs for two models according to the equation:

$$S_{SR}(A,B)=\|y_B-X_B\hat{a}_A\|^2+\|y_A-X_A\hat{a}_B\|^2,$$

where $X_A$, $X_B$ represents device variable values from data sets A and B respectively, $y_A$, $y_B$ actual output values from data sets A and B, and $\hat{a}_A$, $\hat{a}_B$ weights obtained by solving respective matrix equations for data sets A and B. Due to its symmetry, this criterion smoothes out the influence of noise that acts on both parts of the data sample.

The symmetric stability criterion utilizes the following equation for node selection:

$$S_{ss}(W|A,B)=\|y_W-X_w\hat{a}_A\|^2+\|y-X_W\hat{a}_B\|^2,$$

where W denotes the complete training data set W=A∪B. Here local models are used to compute errors with respect to a training data set. The sensitivity to the separation of data is lowered and the influence of noise is averaged (a kind of filtering takes place). This criterion has higher noise immunity.

Lastly, the minimum coefficient bias criterion utilizes the following equation for node selection:

$$S_{MCB}(A,B)=\|\hat{a}_A-\hat{a}_B\|^2$$

This equation compares only weight vectors obtained by solving matrix equations on data sets A and B. The two weight estimates should be in agreement.

The GMDH modeling technique thus expands gradually layer by layer of best units and continually tries to fit training data output to the outputs of each node. By selective use of the node selection criteria, the number of nodes on an output layer of the GMDH network and, hence, the number of circuit models for a particular performance goal can be controlled.

The SVM modeling technique utilizes Support Vector regression to control the number of models output by the SVM model building technique. Several implementations of the SVM model building technique with different decomposition algorithms are available for free download and/or use on the Internet. One suitable SVM modeling technique is LIBSVM, and implementation available from the National Taiwan University in Taipei available at the following web site: www.csie.ntu.edu.tw/~cjlin. The LIBSVM implementation of the SVM modeling technique utilizes two SVM regression methods that allow the user to input different parameters to be used in the process of model building to adjust the process to the values of the device variables and to produce more accurate and faster models. These parameters include:

1. type of regression: ∈-SVR or ν-SVR;
2. type of kernel: linear, polynomial or radial basis function (RBF) kernel;
3. degree of kernel (default 2): valid only for polynomial kernels;
4. gamma (default 1/number of features): gamma in kernel function (valid for polynomial and RBF kernels);
5. coef0 (default 0): coef0 in kernel function (valid for polynomial kernel only);
6. cost (default 1): parameter C of the ∈-SVR or ν-SVR formulation. Parameter C determines the trade off between the model complexity and the degree to which deviations larger than ∈ are tolerated in optimization formulation;
7. ν(default 0.5): parameter ν of the ν-SVR formulation. Desired number of support vectors in the final model;
8. ∈ (default 0.1): parameter ∈ in the loss function of both ∈-SVR and ν-SVR formulation. This parameter controls the width of the ∈-insensitive zone, used to fit the training data. The value of ∈ can affect the number of support vectors used to construct the regression function. The bigger ∈, the fewer support vectors are selected. On the other hand, bigger ∈-values result in more flat estimates. Hence, both C and ∈-values affect model complexity, but in a different way;
9. tolerance (default 0.001): tolerance for termination criterion; and
10. number of points for training and testing.

Given all the parameters, a user can build models utilizing different parameter combinations until the most suitable model is found. General information regarding the SVM modeling technique is disclosed in the following articles: (1) "A (short) Introduction to Support Vector Machines and Kernalbased (sic) Learning", by Johan Suykens, ESANN 2003, Bruges, Belgium, April 2003, http://www.esat.kuleuven.ac.be/sista/lssvmlab/esann2003.pdf and (2) "Support Vector Machines", by Marti A. Hearst, University of California Berkley, July/August 1998, http://www.computer.org/intelligent/ex1998/pdf/x4018.pdf.

As can be seen, the present invention is a method of performance modeling which avoids the use of a single model building technique to develop the performance models for each performance goal of the circuit.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. An automated integrated circuit design method comprising the steps of:
   (a) inputting an initial layout of interconnected circuit devices that define a circuit;
   (b) performing a plurality of circuit simulations for the circuit, with each circuit simulation performed for a unique layout of the circuit devices, with each circuit simulation generating a design point that includes a plurality of device variables for the circuit devices and a plurality of performance goals for the circuit, wherein each device variable and each performance goal has a value associated therewith;
   (c) allocating the design points to a first subset of model building design points and a second subset of validation design points;
   (d) utilizing a first model building technique to determine as a function of the model building design points a first circuit model for one of the performance goals;
   (e) utilizing a second, different model building technique to determine as a function of the model building design points a second, different circuit model for the one performance goal;
   (f) determining for each validation design point a value for the one performance goal as a function of said first circuit model and the values of the device variables of said validation design point;
   (g) determining for each validation design point an error between the value of the one performance goal determined therefor in step (f) and the values of the corresponding performance goal of the validation design point;

(h) determining in connection with the first circuit model an average of the errors determined in step (g);

(i) determining for each validation design point a value for the one performance goal as a function of said second circuit model and the values of the device variables of said validation design point;

(j) determining for each validation design point an error between the value of the one performance goal determined therefor in step (i) and the value of the corresponding performance goal of the validation design point;

(k) determining in connection with the second circuit model an average of the errors determined in step (j);

(l) inputting a set of values of the device variables;

(m) processing the input set of values of the device variables with at least one of the first and second circuit models having the smallest average error associated therewith to determine at least one value for the one performance goal associated therewith; and (n) based on the value of the at least one performance goal determined in step (m), generating a layout of the circuit devices based on the values of the device variables input for said one performance goal in step (l).

2. The method of claim 1, wherein the model building design points and the validation design points are non-overlapping.

3. The method of claim 1, wherein:
the first model building technique is a Group Method of Data Handling (GMDH) model building technique; and
the second model building technique is Support Vector Machines (SVM) model building technique.

4. The method of claim 1, further including scaling each device variable value and each performance goal value of each design point within a predetermined numerical range.

5. The method of claim 4, wherein step (m) includes unscaling the value of the one performance goal.

6. The method of claim 1, wherein, in at least one of the first and second model building techniques, the values of at least two device variables are combined to obtain a new value that replaces said two device variables in the model.

7. The method of claim 1, wherein:
step (d) further includes determining a plurality of first circuit models for the one performance goal;
step (e) further includes determining a plurality of second circuit models for the one performance goal;
step (h) further includes determining in connection with each first circuit model an average of the errors determined in step (g); and
step (k) further includes determining in connection with each second circuit model an average of the errors determined in step (j).

8. The method of claim 1, wherein step (m) includes:
determining a difference between the value of the one performance goal determined utilizing the first circuit model having associated therewith the smallest error of the plurality of first circuit models and the value of the one performance goal determined utilizing the second circuit model having associated therewith the smallest error of the plurality of second circuit models; and
displaying the thus determined difference.

9. The method of claim 1, wherein:
step (d) further includes determining a first circuit model for each performance goal of a subset of the model building design points;

step (e) further includes determining a second circuit model for each performance goal of the subset of the model building design points;

step (h) further includes determining in connection with each first circuit model an average of the errors determined in step (g);

step (k) further includes determining in connection with each second circuit model an average of the errors determined in step (j);

step (m) further includes processing the input set of device variable values with the first or second circuit model of each performance goal of the subset of the model building design points having the smallest average error associated therewith to determine a value for the performance goal; and step (n) further includes, based on the values determined for the performance goals in step (m), generating a layout of the circuit devices based on the values of the device variables input for said performance goals in step (l).

10. A computer readable medium having stored thereon instructions which, when executed by a processor, cause the processor to perform the steps:

(a) receive an initial layout of interconnected circuit devices that define a circuit;

(b) perform a plurality of circuit simulations for the circuit, with each circuit simulation performed for a unique layout of the circuit devices, with each circuit simulation generating a design point that includes a plurality of device variables for the circuit devices and a plurality of performance goals for the circuit, wherein each device variable and each performance goal has a value associated therewith;

(c) allocate the design points between a first subset of model building design points and a second subset of validation design points;

(d) determine a first circuit model and a second, different circuit model for one of the performance goals as a function of the model building design points;

(e) determine for each validation design point a value for the one performance goal as a function of said first circuit model and the values of the device variables of said validation design point;

(f) determine for each validation design point an error between the value of the one performance goal determined in step (e) and the value of the corresponding performance goal of the validation design point;

(g) determine in connection with the first circuit model an average of the errors determined in step (f);

(h) determine for each validation design point a value for the one performance goal as a function of said second circuit model and the values of the device variables of said validation design point;

(i) determine for each validation design point an error between the value of the one performance goal determined in step (h) and the value of the corresponding performance goal of the validation design point;

(j) determine in connection with the second circuit model an average of the errors determined in step (i);

(k) receive a set of device variable values;

(l) process the received set of device variable values with at least one of the first and second circuit models having the smallest error associated therewith to determine a value for the one performance goal associated therewith; and (m) based on the value of the one performance goal determined in step (l), generate a layout of the circuit devices based on the device variable values input in step (k).

11. The computer readable medium of claim 10, wherein step (d) includes processing the first subset of design points with a first model building technique and a second, different model building technique to determine the first and second circuit models, respectively.

12. The computer readable medium of claim 11, wherein, in at least one of the first and second model building techniques, the values of at least two device variables are combined to obtain a new value that replaces said two device variables in the model.

13. The computer readable medium of claim 11, wherein:
the first model building technique is a Group Method of Data Handling (GMDH) model building technique; and
the second model building technique is Support Vector Machines (SVM) model building technique.

14. The computer readable medium of claim 10, wherein the model building design points and the validation design points are non-overlapping.

15. The computer readable medium of claim 10, wherein the instructions further cause the processor to scale each device variable value and each performance goal value of each design point within a predetermined numerical range.

16. The computer readable medium of claim 10, wherein, in step (l), the instructions further cause the processor to unscale the value of the one performance goal.

17. The computer readable medium of claim 10, wherein:
step (d) further includes determining for the one performance goal a plurality of first circuit models and a plurality of second circuit models;
step (g) further includes determining in connection with each first circuit model an average of the errors determined in step (f); and
step (j) further includes determining in connection with each second circuit model an average of the errors determined in step (i).

18. The computer readable medium of claim 10, wherein step (l) further includes:
determining a difference between the value of the one performance goal determined utilizing the first circuit model having associated therewith the smallest error of the plurality of first circuit models and the value of the one performance goal determined utilizing the second circuit model having associated therewith the smallest error of the plurality of second circuit models; and
displaying the thus determined difference.

19. The computer readable medium of claim 10, wherein:
step (d) further includes determining first and second circuit models for each performance goal of a subset of the model building design points;
step (g) further includes determining in connection with each first circuit model an average of the errors determined in step (f);
step (j) further includes determining in connection with each second circuit model an average of the errors determined in step (i);

step (l) further includes processing the input set of device variable values with the first or second circuit model of each performance goal of the subset of the model building design points having the smallest average error associated therewith to determine a value for the performance goal; and
step (m) further includes, based on the values determined for the performance goals in step (l), generating a layout of the circuit devices based on the device variable values received in step (k).

20. An automated integrated circuit design method comprising the steps of:
(a) inputting an initial layout of interconnected circuit devices that define a circuit;
(b) performing a plurality of circuit simulations for the circuit, with each circuit simulation performed for a unique layout of the circuit devices, with each circuit simulation generating a design point that includes device variable values for the circuit devices and performance goal values for the circuit;
(c) determining a plurality of different circuit models for one of the performance goals as a function of a first subset of the design points;
(d) determining for each circuit model a value for the one performance goal as a function of the circuit model and the values of the device variables obtained from a second subset of the design points;
(e) determining for each circuit model errors between the value of the one performance goal determined in step (d) and values of corresponding performance goals obtained from the second subset of design points;
(f) inputting a set of device variable values;
(g) processing the input set of device variable values with at least one of the circuit models having the smallest error associated therewith to determine at least one value for the one performance goal;
(h) repeating steps (f) and (g) a plurality of times with a new set of device variable values input in each repetition; and
(i) generating a layout of the circuit devices utilizing the device variable values processed in one of the repetitions of step (g).

21. The method of claim 20, wherein step (c) further includes determining a first circuit model and a second circuit model for the one performance goal.

22. The method of claim 20, wherein:
step (c) further includes determining a plurality of different circuit models for each performance goal of the circuit; and
step (g) further includes processing the input set of device variables with the circuit model associated with each performance goal having the smallest error associated therewith to determine a value for the performance goal.

* * * * *